(12) United States Patent
Rieken

(10) Patent No.: US 6,665,817 B1
(45) Date of Patent: Dec. 16, 2003

(54) APPARATUS AND METHOD FOR IMPLEMENTING A WIRELESS SYSTEM-ON-A-CHIP WITH A REPROGRAMMABLE TESTER, DEBUGGER, AND BUS MONITOR

(75) Inventor: Keith Rieken, Cupertino, CA (US)

(73) Assignee: Morphics Technology, Inc., Campbell, CA (US)

(*) Notice: Subject to any disclaimer, the term of this patent is extended or adjusted under 35 U.S.C. 154(b) by 0 days.

(21) Appl. No.: 09/565,688

(22) Filed: May 5, 2000

Related U.S. Application Data
(60) Provisional application No. 60/133,140, filed on May 7, 1999.

(51) Int. Cl.⁷ .................................................. G06F 11/27
(52) U.S. Cl. .......................................... 714/30; 714/733
(58) Field of Search ........................... 714/30–726, 729, 714/733–734

(56) References Cited

U.S. PATENT DOCUMENTS

| | | | |
|---|---|---|---|
| 5,331,681 A | | 7/1994 | Doi et al. ............... 377/116 |
| 5,425,036 A | * | 6/1995 | Liu et al. ............... 714/725 |
| 5,548,717 A | | 8/1996 | Wooldridge et al. |
| 5,566,088 A | | 10/1996 | Herscher et al. ......... 364/514 |
| 5,572,664 A | | 11/1996 | Bujanos |
| 5,630,048 A | * | 5/1997 | La Joie et al. ........... 714/25 |
| 5,701,417 A | | 12/1997 | Lewis et al. |
| 5,717,704 A | | 2/1998 | Rosenfeld |
| 5,764,650 A | | 6/1998 | Debenham |
| 5,768,382 A | | 6/1998 | Schneier et al. |
| 5,771,240 A | * | 6/1998 | Tobin et al. ............. 714/30 |
| 5,790,568 A | | 8/1998 | Luong et al. |
| 5,909,544 A | | 6/1999 | Anderson, II et al. |
| 5,942,981 A | | 8/1999 | Kackman |
| 5,968,192 A | | 10/1999 | Kornachuk et al. ...... 714/724 |
| 5,978,943 A | | 11/1999 | Narukawa ............... 714/725 |
| 5,982,681 A | * | 11/1999 | Schwarz ................. 365/201 |
| 6,256,758 B1 | * | 7/2001 | Abramovici et al. ...... 714/724 |
| 6,286,114 B1 | * | 9/2001 | Veenstra et al. ......... 703/16 |
| 6,415,393 B2 | * | 7/2002 | Satoh ..................... 712/227 |

FOREIGN PATENT DOCUMENTS

| | | |
|---|---|---|
| WO | WO99/41837 A1 | 8/1999 |
| WO | WO99/56394 | 11/1999 |

OTHER PUBLICATIONS

High Availability Power Bus System; IBM Technical Disclosure Bulletin, Jun. 1990.
Reconfigurable Hardware for a Hardware Simulation Engine; IBM Technical Disclosure Bulletin, Aug. 1990.
Brown and Feher, "Reconfigurable Digital Baseband Modulation for Wireless Computer Communication", *IEEE*, Jul. 1995, pp. 610–616.
Christopher et al., A Fully Integrated Digital Demodulation and Forward Error Correction IC for Digital Satellite Television, *IEEE*, Feb. 1995, pp. 13.1.1–13.1.3.
Mouldin et al., "Low Probability of Detection Tactical Wireless LAN Supporting Command and Control on the Move", *IEEE*, Oct. 1993, pp. 585–589.
Oppermann, Multichip–Modules (MCMs) for Micro– and Millimeter–Wave Applications—a Challenge?, *IEEE*, Aug. 1998, pp. 279–284.

* cited by examiner

Primary Examiner—Scott Baderman
(74) Attorney, Agent, or Firm—Darby & Darby

(57) ABSTRACT

A wireless communication system-on-a-chip comprises a system bus, a set of fixed function processors connected to the system bus, an embedded processor connected to the system bus, and reconfigurable logic connected to the system bus. The reconfigurable logic supports an operational mode and a diagnostic mode. In the operational mode, the system operates to support different air interface protocols and data rates. In the diagnostic mode, the system alternately tests the system, debugs the system, and monitors bus activity within the system.

21 Claims, 6 Drawing Sheets

APPARATUS AND METHOD FOR IMPLEMENTING A WIRELESS SYSTEM-ON-A-CHIP WITH A REPROGRAMMABLE TESTER, DEBUGGER, AND BUS MONITOR

This application claims priority to provisional patent application Ser. No. 60/133,140 filed May 7, 1999.

BRIEF DESCRIPTION OF THE INVENTION

This invention relates generally to wireless communications. More particularly, this invention relates to a wireless communications system implemented on a single chip, which includes a reprogrammable tester, debugger, and bus monitor.

BACKGROUND OF THE INVENTION

A substantial obstacle to implementing a wireless communications system on a single chip is the problem of testing and debugging such an embedded system. Testing of a system-on-a-chip ensures the integrity of the manufacturing process by identifying manufacturing faults through the use of well-defined vector sets applied to the chip after production. These vectors can be defined using several techniques, such as ATPG (Automatic Test Pattern Generation), embedded logic BIST (Built-in-Self-Test) or embedded RAM BIST. The type of technique selected dictates the use of a specific hardware structure to implement the testing function.

Debugging of embedded software within embedded processors requires additional hardware resources to enable single-cycle execution, instruction insertion and break pointing techniques. Hardware resources that are required to support these functions are typically dedicated solely to these functions.

Another function required for today's embedded wireless systems is the ability to monitor the traffic which occurs on an embedded, shared system bus. Today, the function is usually implemented with dedicated hardware structures which "snoop" for and record specific types of bus transactions. This information can then be exported and used to tune the bus bandwidth requirements of the system.

Thus, current techniques to test, debug and monitor an embedded processor require dedicated hardware and are limited in capability. Accordingly, it would be highly desirable to provide a technique for testing, debugging, and bus monitoring of a wireless communications system-on-a-chip.

SUMMARY OF THE INVENTION

A wireless communication system-on-a-chip comprises a system bus, a set of fixed function processors connected to the system bus, an embedded processor connected to the system bus, and reconfigurable logic connected to the system bus. The reconfigurable logic supports an operational mode and a diagnostic mode. In the operational mode, the system operates to support different air interface protocols and data rates. In the diagnostic mode, the system alternately tests the system, debugs the system, and monitors bus activity within the system.

The invention includes a reconfigurable controller with a configuration and test controller and reconfigurable logic. The reconfigurable logic supports testing operations in a first mode, debugging operations in a second mode, and bus monitoring operations in a third mode.

The invention uses a reprogrammable fabric for a multitude of temporal functions which occur at different times in the product life cycle. Testing occurs at the time of manufacturing, debugging occurs during bring-up, and bus monitoring may occur to tune the system performance over the life of the product. By leveraging the same reconfigurable logic on the chip, all these functions are implemented in the same logic, assuming the proper signal interfaces are defined prior to production.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
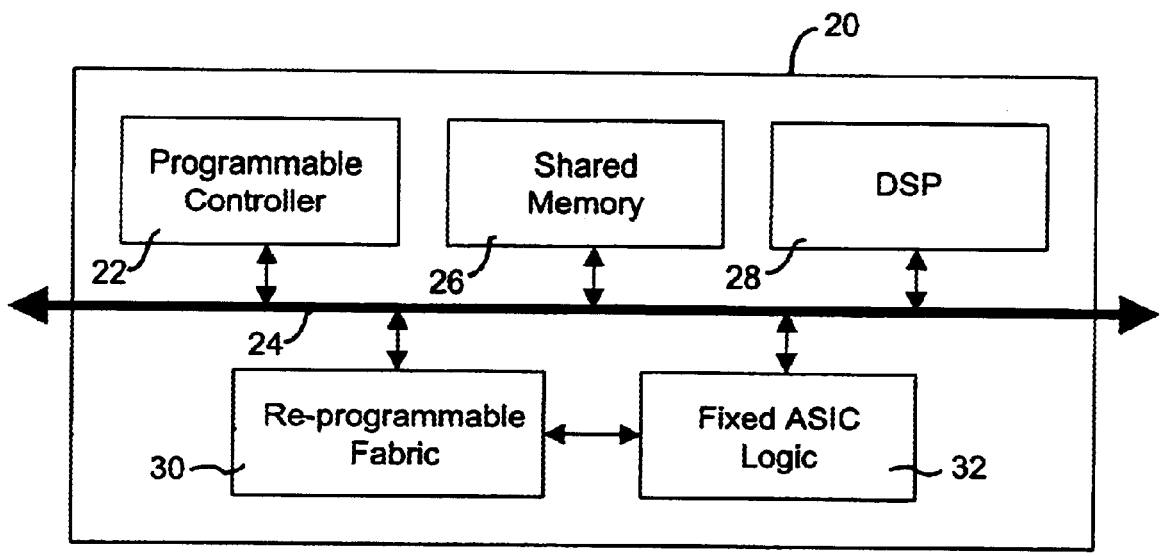
FIG. 1 illustrates an embedded reprogrammable logic system architecture in accordance with an embodiment of the invention.

FIG. 1 illustrates an embedded reprogrammable logic system architecture 20 in accordance with an embodiment of the invention. The system 20 includes a programmable controller 22 attached to a system bus 24. Also attached to the system bus 24 are shared memory 26, a DSP 28, reprogrammable fabric 30, and fixed ASIC logic 32. As shown below, the programmable controller 22 and the DSP 28 may be combined to form a single embedded processor. The fixed ASIC logic may itself be parameterizable through a set of configuration registers. These configuration registers can be programmed after reset using the existing scan chain logic with minimal overhead.

Figure 2:
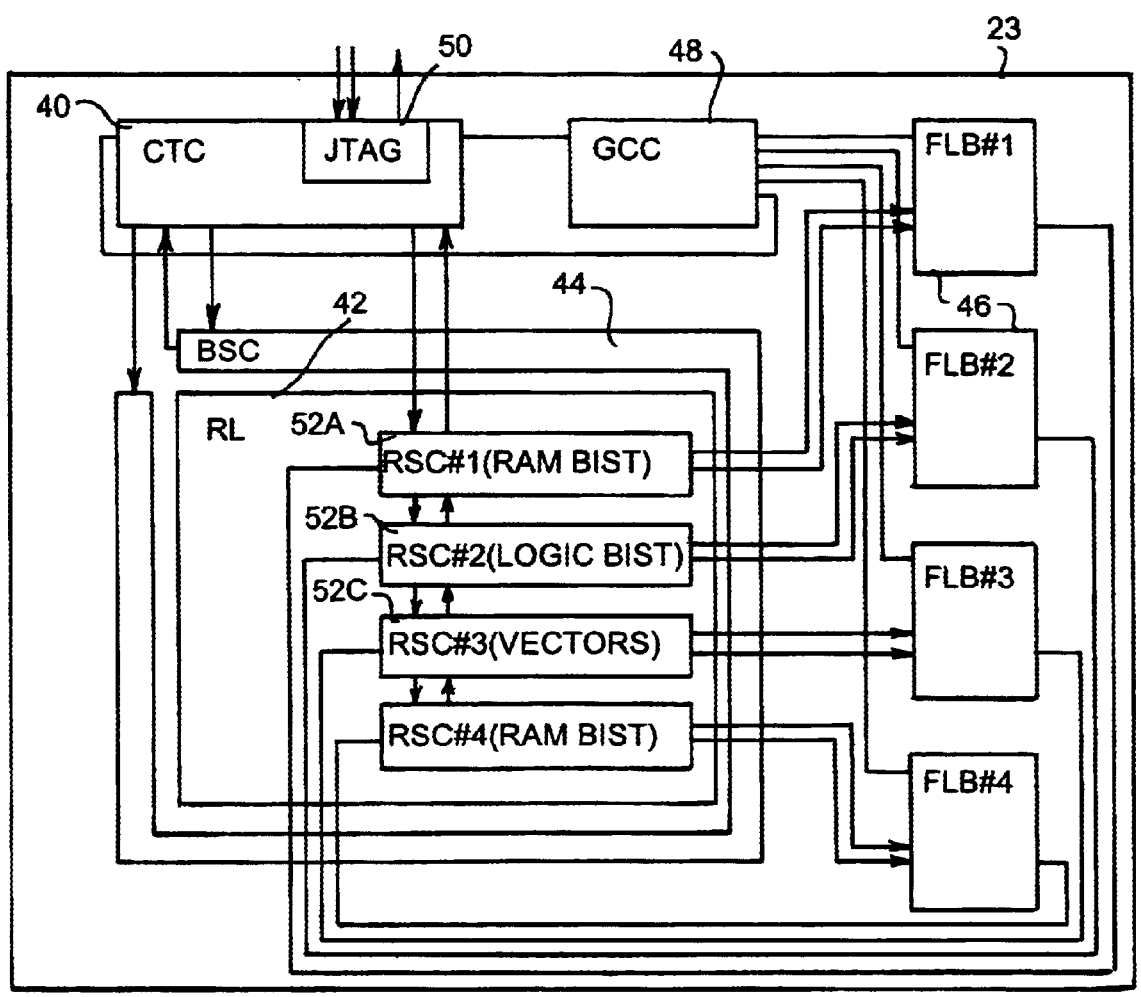
FIG. 2 illustrates a reprogrammable test controller in accordance with an embodiment of the invention.

FIG. 2 illustrates the architecture 23 of individual components of FIG. 1. In particular, FIG. 2 illustrates a Configuration and Test Controller 40 corresponding to the programmable controller 22, Reprogrammable Logic 42 corresponding to reprogrammable fabric 30, and fixed function logic blocks 46 corresponding to fixed ASIC logic 32.

The Reprogrammable Logic (RL) 42 contains the necessary programming memory used for the configuration of individual test controllers, each of which is controlled by the CTC 40. The system 23 also includes a boundary scan chain (BSC) 44 for testing the reprogrammable logic and multiple external fixed logic blocks (FLBs) 46 with serial scan chain access from the reprogrammable logic 42. Access to peripheral clocks is through a global clock controller (GCC) 48. External access to the CTC 40 is through a well defined serial/parallel interface 50, such as the Joint Test Access Group (JTAG) standard.

The CTC 40 provides the functionality to test the reprogrammable fabric hardware for manufacturing faults through the use of the boundary scan and configuration logic of the fabric. Additionally, the CTC 40 is used to configure the reprogrammable fabric to a well-defined function through the application of configuration bits supplied through the external interface 50.

The reprogrammable fabric or RL 42 in FIG. 2 is a hardware structure and associated configuration memory that provides varying functionality depending on the state of the configuration memory. In one embodiment, the hardware structure consists of programmable functional units which are connected via reconfigurable interconnect modules.

The fixed logic blocks 46 are dedicated hardware resources to support baseband processing functions, such as equalization, despreading/demodulation, combining or channel decoding. The fixed logic blocks 46 are dedicated, parameterized processing kernels which can be configured to accomodate multiple algorithmic realization of baseband processing functions. The GCC 48 provides the necessary control over the clocking structures to the fixed logic blocks to enable the scan chain access to these blocks.

Individual test controllers 52 for independent fixed logic blocks can be chosen based on the requirements of the associated fixed logic block. Reprogrammability provides support for most standard test strategies. By way of example, individual test controllers 52A–52C are provided to support the following strategies. First, a RAM BIST (RSC#1, RSC#4) strategy is supported. This strategy is based on Linear Feedback Shift Registers (LFSRs), walking-one's or alternative algorithms. RAM BIST is preferably used to verify functionality on all-layer RAM implementations. The RAM BIST controller performs address generation for each word of the RAM to be tested, data generation and data comparison. The control first walks through the RAM addresses writing specific data into each word location. The second pass through the RAM is used to read out the contents previously written and compare against the expected value. Many different patterns may be employed to improve the coverage of all types of likely manufacturing faults which can occur in the RAM.

Second, a LOGIC BIST (RSC#2) strategy is supported. LOGIC BIST is a technique similar to RAM BIST, using LFSRs in conjunction with signature analysis to verify proper functioning of isolated logic blocks. The logic BIST controller is used to generate a specific pseudo-random sequence which is applied to the inputs of a given functional block. The outputs from the functional block are then compared against a known "signature" of the function which is expected at the outputs. Any mismatch relative to the expected signature is likely to be the result of a manufacturing defect.

Third, test vectors are also supported. VECTORS (RSC#3) provide a full or partial Automatic Test Pattern Generation (ATPG) capability which may be parallelized across multiple scan chains in the reprogrammable logic. The ATPG vector controller is a local scan chain controller which provides a mechanism for serially scanning into a fixed logic block, issuing a single clock cycle (in conjunction with the GCC 48 block) and scanning out the actual results for external comparison. If the inputs of the block are controllable by this controller and the outputs are observable, then full or partial scan techniques may be employed in isolation to increase the coverage in finding manufacturing faults in the silicon.

Figure 3:
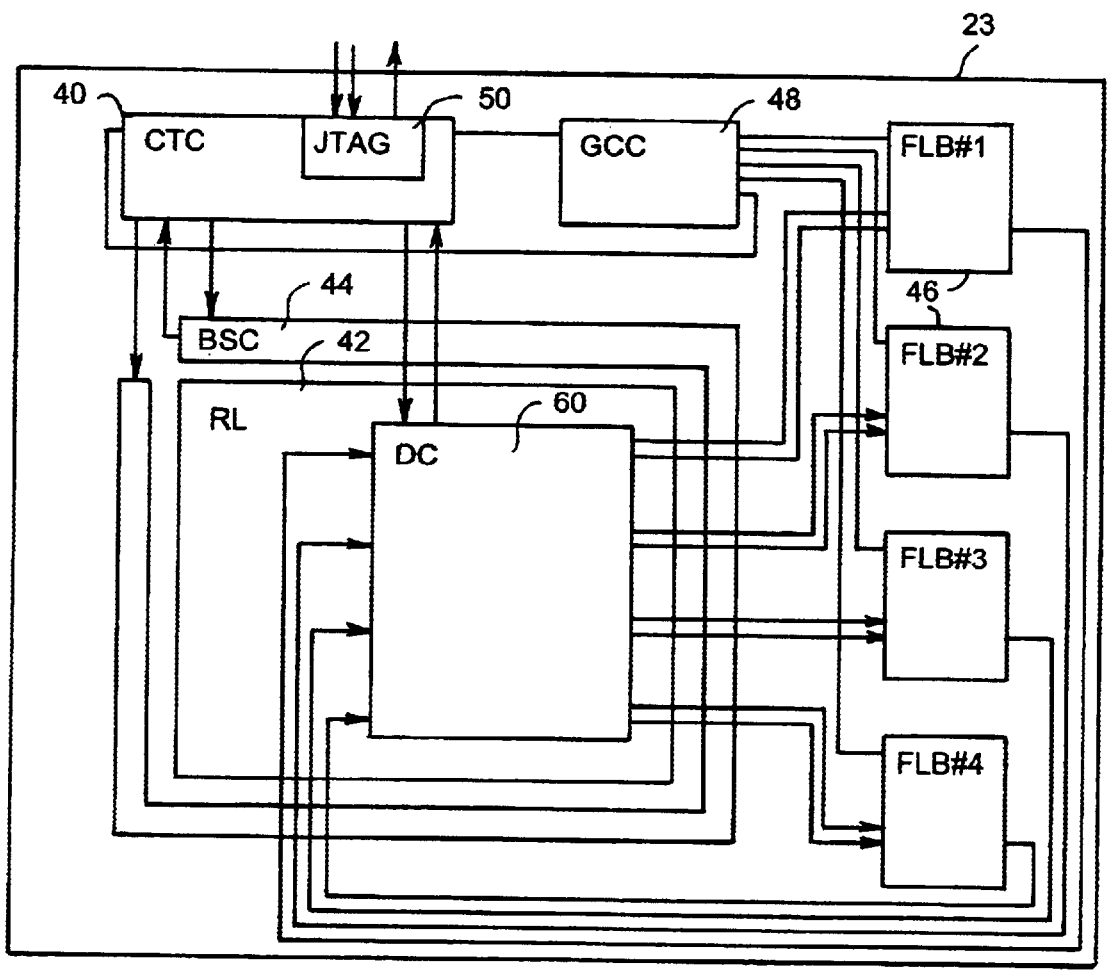
FIG. 3 illustrates a debug control architecture in accordance with an embodiment of the invention.

Upon completion of manufacturing test, the individual test controllers 52 may be removed and replaced with a debug control (DC) circuit 60, as shown in FIG. 3. This is accomplished by providing not only the test interface signals into the reprogrammable interconnect mesh 42, but by also providing any necessary debug interface signals into the same mesh. Thus, depending on the current configuration, either set of control signals may be accessed at a given time.

The debug control circuit 60 and associated support software provides visibility into the internal state of the fixed logic blocks 46 of static devices (clocks can be disabled and state retained). The debug control circuit is a device for monitoring and reporting specified events within a well-defined logic block. Prior to circuit fabrication, certain probe points must be established and the data selection provided to enable the debugging control function. The controller is responsible for selecting the correct event to monitor at any given time and reporting specific information (such as the total time of the event, as indicated by a counter mechanism). The reconfigurable fabric is flexible enough to allow the debug controller to evolve over time. The access probe points, however, need to be defined a priori and propagated to the reconfigurable interconnect mesh interface.

The controller 22 provides at least three important advantages for system designers. First, the controller 22 minimizes the amount of fixed logic resources necessary for testing complex system-on-a-chip applications (typically represented by an approximately 5% overhead in controller logic resources/die area). Second, the system 22 provides flexibility in test program generation by supporting multiple test techniques. Third, the system 22 enables improved debugging and field diagnostics capabilities.

Figure 4:
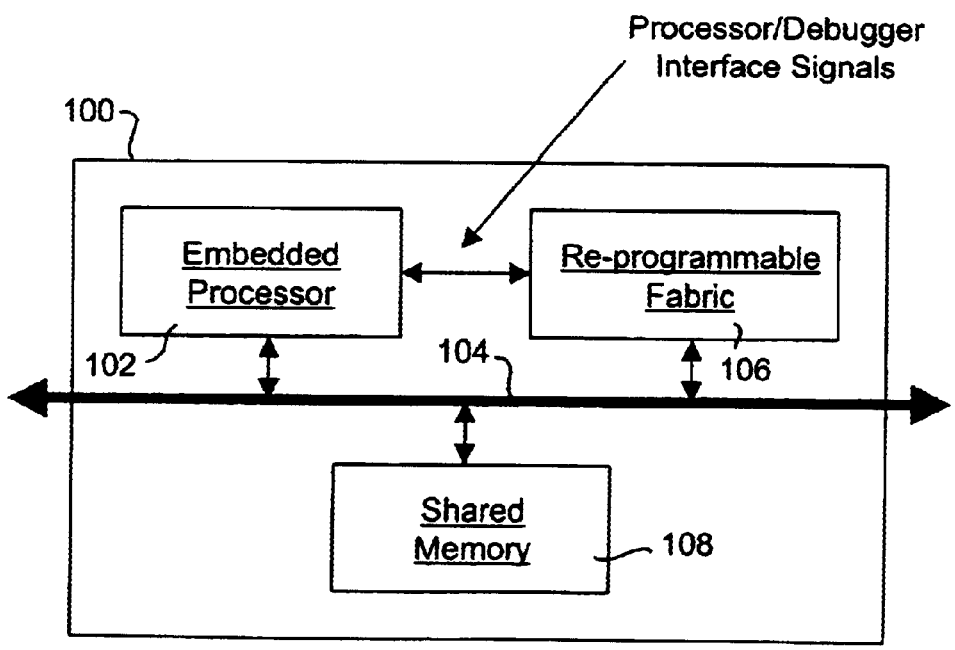
FIG. 4 illustrates an embedded processor core and reprogrammable logic system architecture in accordance with another embodiment of the invention.

FIG. 4 illustrates an embedded processor core and reprogrammable logic system architecture 100 in accordance with another embodiment of the invention. The system 100 includes an embedded processor 102 connected to a system bus 104. A reprogrammable fabric 106 and shared memory 108 are also connected to the system bus 104.

FIG. 4 represents a subset system (without a DSP) for demonstration of another temporal function which may be employed in conjunction with embedded processors or DSPs. The function is dependent on having necessary control and observation internal to the embedded processor to enable functions, such as break pointing or single-stepping the processor. Again, the necessary signals to the processor (or DSP), must be known a priori and propagated to the programmable interconnect mesh for use by the reconfigurable logic in implementing the processor debugger functions.

Figure 5:
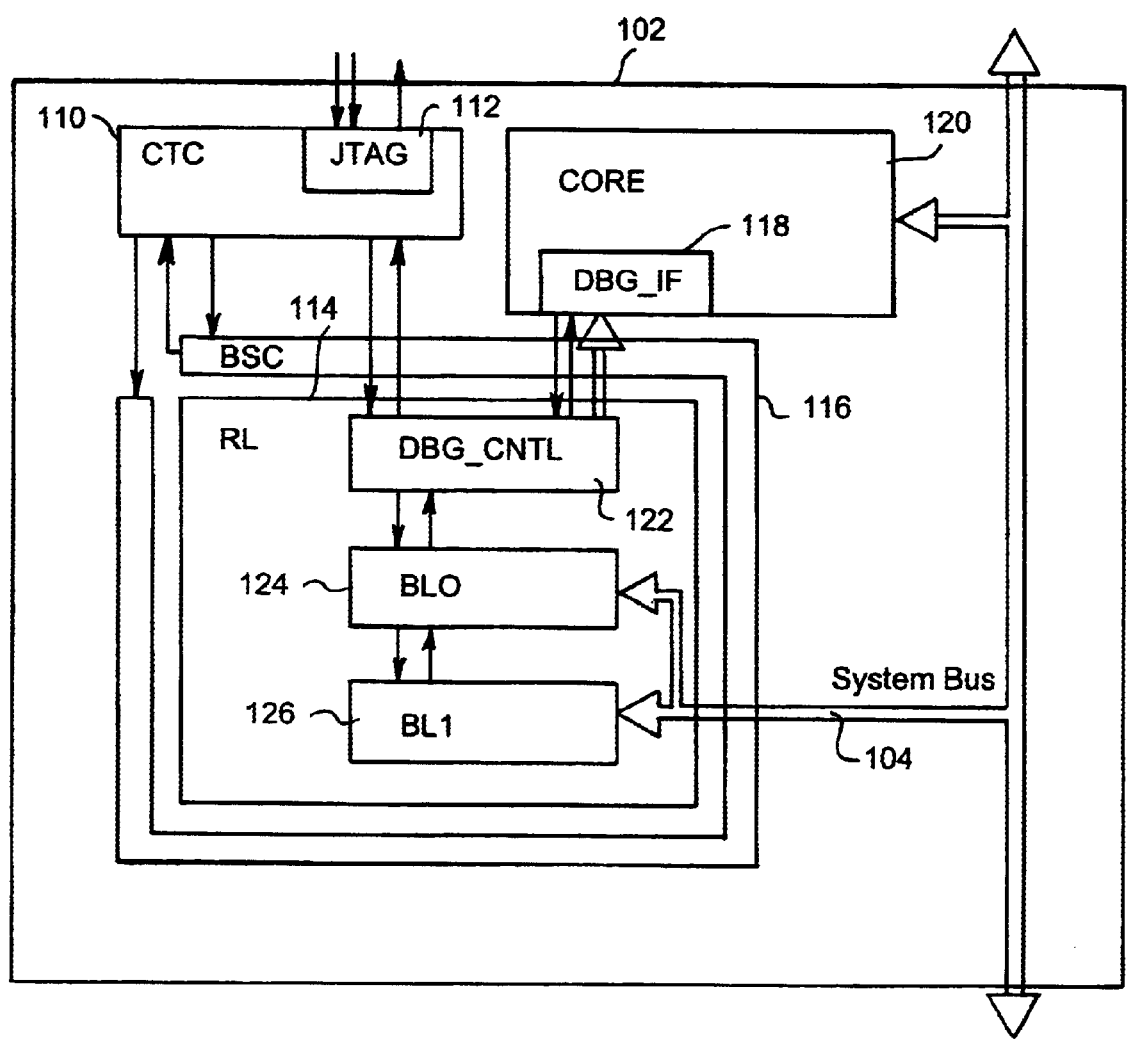
FIG. 5 illustrates a reprogrammable embedded processor debugger in accordance with an embodiment of the invention.

FIG. 5 illustrates a generic architecture for a reprogrammable embedded processor debugger 102. The system 102 consists of a configuration and test controller (CTC) 110, which includes a serial JTAG interface 112 for external control, the embedded target application reprogrammable logic (RL) 114, which contains necessary programming memory (used for configuration of the actual debugger logic), a boundary scan chain (BSC) 116 for testing the reprogrammable logic 114, and a hardwired interface to necessary bus/processor core signals. Individual embedded core and bus architectures will dictate the final hardwire interface requirements.

This architecture provides support for standard debugging functionality and is only limited by the reprogrammable logic input/output requirements for the final (resident) application and the access to necessary core interface control signals to enable the debugging capabilities. For example, single stepping requires a static core (does not change state when a global disable signal is asserted from the debugger, i.e., a clock enable) while instruction insertion requires an interface which allows full instructions to be multiplexed into the instruction fetch logic of the core for further execution. Finally, breakpoint capabilities may require some additional logic in the core to detect breakpointed instructions or data fetches. These functions are represented generically with the following logic blocks.

First, there is a DBG_IF block 118 embedded in a core 120. The DBG_IF block 118 establishes interface logic associated with the embedded processor core to support the debugging functions to the core. Second, there is a DBG_CNTL block 122 in the reprogrammable logic 114. The DBG_CNTL block 122 is a controller which allows the external JTAG interface to control and observe the registers contained in the RL debugger logic. This allows the breakpoint registers to be setup, bus or control signals to be monitored and serially scanned out, and the scanning in of new instructions. Third, there are blocks BL0 124 and BL1 126 in the reprogrammable logic 114. These blocks operate as breakpoint units which compare data/address/control values from the bus and core to determine when a breakpoint has occurred. Upon completion of any temporal debugging functions, the reprogrammable logic 114 is then configured for its final, resident application.

Those skilled in the art will appreciate that this embodiment of the invention provides a debugger with significant run-time visibility and debug capability. The architecture minimizes dedicated hardware for runtime debugging support in embedded processors. In addition, the architecture provides post-manufacturing configurability of debugging resources.

Figure 6:
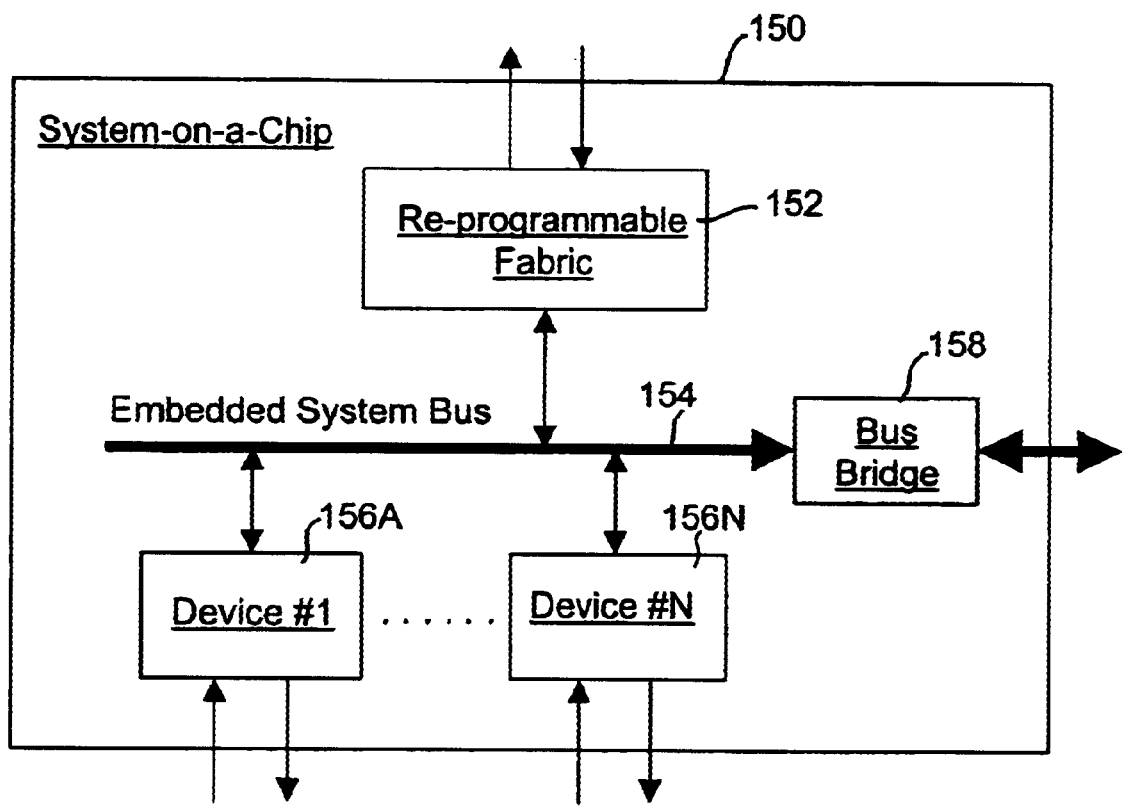
FIG. 6 illustrates an embedded system bus and reprogrammable logic system architecture in accordance with an embodiment of the invention.

FIG. 6 illustrates an embedded system bus and reprogrammable logic system architecture 150 in accordance with another embodiment of the invention. The system 150 includes a reprogrammable device 152 connected to a system bus 154. A set of devices 156A through 156N are also attached to the system bus 154. A bus bridge 158 is also attached to the system bus 154.

Figure 7:
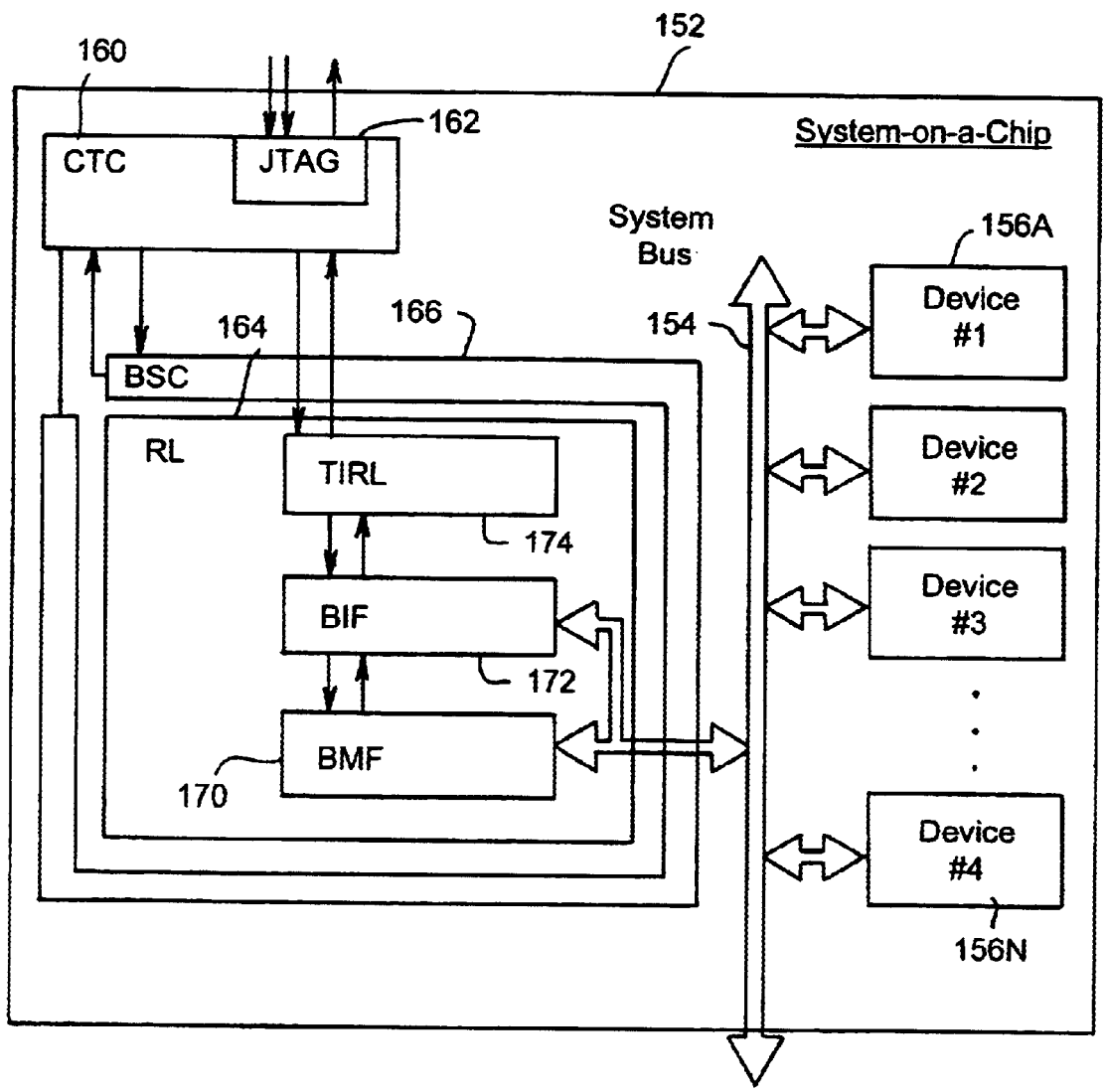
FIG. 7 illustrates a reprogrammable system bus monitoring architecture in accordance with an embodiment of the invention.

FIG. 7 illustrates a generic architecture for a reprogrammable bus monitoring function in accordance with the system of FIG. 6. The system 152 includes a configuration and test controller (CTC) 160, which includes a serial JTAG interface 162. The system of FIG. 7 also includes embedded target application reprogrammable logic 164, which contains necessary programming memory (used for configuration of the actual bus monitoring function), a boundary scan chain (BSC) 166 for testing the reprogrammable logic, and a hardwired interface to necessary system bus signals. As with previous embodiments, individual bus architectures dictate the final hardwire interface requirements.

This architecture provides support for standard bus monitoring/control functionality and is only limited by the reprogrammable logic 164 input/output requirements for the final (resident) application, the amount of reprogrammable logic 164 available for use in monitoring/controlling logic, and the access to necessary system bus interface signals. For example, fault insertion can be accomplished by configuring the reprogrammable logic 164 to mimic the behavior of a compatible bus interface controller. The fault can then be generated through programming a temporary driver application to generate the fault on the bus interface. Pure monitoring functions can be programmed into the reprogrammable logic 164 and then be scanned out through the JTAG interface 162. These functions are represented generically with the following logic blocks.

First, BMF block 170 is the programmable bus monitoring function which counts active/idle cycles, determines target/initiators of transactions, and enables the captured data to be scanned out to the JTAG interface. Second, the BIF block 172 is a reprogrammable implementation of the bus interface that enables the reprogrammable logic to appear as either a master or a slave on the system bus. The TIRL block 174 is the transaction initiation/response logic which enables the reprogrammable logic 164 to appear as a temporary application on the bus. Thus, the block is capable of initiating or responding to transactions and asserting or monitoring bus faults on the embedded system bus.

Upon completion of any temporal bus monitoring/control functions, the reprogrammable logic 164 is then configured for its final, resident application. This embodiment of the invention provides bus monitoring and control functions for runtime monitoring and system debug operations. The invention has a configurable architecture that supports independent bus interface standards. Further, the invention provides flexible control functions and user-defined monitoring and control capability. The invention minimizes dedicated hardware necessary to provide run time bus monitoring and control in embedded bus systems. Finally, the invention provides post-manufacturing configurability of bus monitoring and control resources.

Observe that the invention uses serial scan chains to provide run-time configuration and run-time debug observability and controllability of configurable ASIC logic blocks. Serial scan chains have traditionally been limited to the context of manufacturing tests. The invention uses serial scan chains to read, modify and write the state of the ASIC (including tables, multiplexor controls, state machines, reconfigurable datapaths, memories, sequential state elements, and any other volatile storage) as a method for performing run-time configuration, alternative algorithm selection, and run-time debug.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A reconfigurable controller, comprising:

a configuration and test controller; and reconfigurable logic connected to said configuration and test controller, wherein said reconfigurable logic is configured to perform bus emulation operations in one mode, and is reconfigured to perform at least one of the functions selected from a group consisting of hardware testing operations, software debugging operations, and bus monitoring operations in another mode.

2. The reconfigurable controller of claim 1 wherein said configuration and test controller includes a Joint Test Access Group (JTAG) interface.

3. The reconfigurable controller of claim 1 wherein said bus emulation operations include at least one function selected from a group consisting of emulating temporary applications, fault insertion, transaction initiation, transaction responding, emulating as a bus master and emulating as a bus slave.

4. The reconfigurable controller of claim 1 wherein said hardware testing operations include at least one function selected from a group consisting of Random Access Memory Built In Self Test (RAM BIST), Logic Built In Self Test (Logic BIST), Boundary Scan Chain (BSC), Automatic Test Pattern Generation (ATPG) and Signature Analysis testing.

5. The reconfigurable controller of claim 1 wherein said software debugging operations include at least one function selected from a group consisting of single stepping, instruction insertion, breakpoint insertion, monitoring and reporting specified events occurring in connection with fixed logic blocks and static devices.

6. The reconfigurable controller of claim 1 wherein said bus monitoring operations include run-time bus monitoring and user-defined monitoring functions.

7. The reconfigurable controller of claim 1 wherein the controller resides within a target system under testing.

8. A reconfigurable controller, comprising:
a configuration and test controller; and
a reconfigurable logic connected to said configuration and test controller, said reconfigurable logic supporting testing operations in a first mode, debugging operations in a second mode, and bus monitoring operations in a third mode, wherein said reconfigurable logic supports a bus emulator function during said third mode.

9. A reconfigurable controller, comprising:
a bus;
a set of fixed function processors coupled to said bus;
a configuration and test controller; and
reconfigurable logic connected to said configuration and test controller, said reconfigurable logic supporting testing operations in a first mode, debugging operations in a second mode, and bus monitoring operations in a third mode.

10. The reconfigurable controller of claim 9, wherein said set of fixed function processors support baseband processing.

11. The reconfigurable controller of claim 9, further comprising serial scan chains to provide run-time configuration, alternative algorithm selection, and run-time debug for a fixed function processor of said set of fixed function processors.

12. The reconfigurable controller of claim 9, further comprising configuration registers for parameterizing a fixed function processor of said set of fixed function processors.

13. The reconfigurable controller of claim 12, wherein said configuration registers are programmable after reset using scan chain logic.

14. A reconfigurable controller, comprising:
a configuration and test controller; and
reconfigurable logic connected to said configuration and test controller, said reconfigurable logic supporting testing operations in a first mode, debugging operations in a second mode, and bus monitoring operations in a third mode, wherein said reconfigurable logic further supports an operational mode for different air interface protocols and data rates.

15. A method for operating a reconfigurable controller, comprising:
configuring reprogrammable logic of the reconfigurable controller for performing the function of bus emulation in one mode; and
reconfiguring said reprogrammable logic for performing at least one of the functions selected from a group consisting of hardware testing operations, software debugging operations, and bus monitoring operations in another mode.

16. The method of claim 15, wherein said configuration controller includes a Joint Test Access Group (JTAG) interface.

17. The method of claim 15, wherein said step of performing the function of bus emulation includes at least one function selected from a group consisting of emulating temporary applications, fault insertion, transaction initiation, transaction responding, emulating as a bus master and emulating as a bus slave.

18. The method of claim 15, wherein said step of performing the function of hardware testing operations includes at least one function selected from a group consisting of Random Access Memory Built In Self Test (RAM BIST), Logic Built In Self Test (Logic BIST), Boundary Scan Chain (BSC), Automatic Test Pattern Generation (ATPG) and Signature Analysis testing.

19. The method of claim 15, wherein said step of performing the function of software debugging operations includes at least one function selected from a group consisting of single stepping, instruction insertion, breakpoint insertion, monitoring and reporting specified events occurring in connection with fixed logic blocks and static devices.

20. The method of claim 15, wherein said step of performing the function of bus monitoring operations includes run-time bus monitoring and user-defined monitoring functions.

21. The method of claim 15 wherein said reconfigurable controller resides within a target system under testing.

* * * * *